United States Patent [19]
Tanaka et al.

[11] Patent Number: 5,312,803
[45] Date of Patent: May 17, 1994

[54] PROCESS FOR PRODUCING BI- AND PB-CONTAINING OXIDE SUPERCONDUCTING WIRING FILMS

[75] Inventors: Atsushi Tanaka; Kazunori Yamanaka; Nobuo Kamehara; Koichi Niwa, all of Kawasaki, Japan

[73] Assignee: Fujitsu Limited, Kawasaki, Japan

[21] Appl. No.: 861,823

[22] PCT Filed: Oct. 17, 1991

[86] PCT No.: PCT/JP91/01422
§ 371 Date: Jun. 16, 1992
§ 102(e) Date: Jun. 16, 1992

[87] PCT Pub. No.: WO92/07381
PCT Pub. Date: Apr. 30, 1992

[30] Foreign Application Priority Data

Oct. 17, 1990 [JP] Japan ................................ 2-276506
Mar. 18, 1991 [JP] Japan ................................ 3-51882
Mar. 18, 1991 [JP] Japan ................................ 3-51883

[51] Int. Cl.$^5$ .............................................. B05D 5/12
[52] U.S. Cl. .................................. 505/471; 505/704;
505/730; 505/731; 505/732; 505/741; 505/742;
505/476; 505/501; 427/62; 427/63; 427/126.3;
427/282
[58] Field of Search ............... 505/1, 704, 730, 731,
505/732, 741, 742; 427/62, 63, 282, 126.3

[56] References Cited
FOREIGN PATENT DOCUMENTS 1-282105 11/1989 Japan .
2-170311 7/1990 Japan .
2-175613 7/1990 Japan .

OTHER PUBLICATIONS

Nabatame et al, "Properties of $Tl_2Ba_2Ca_2Cu_3O_x$ thin films with a Critical Temperature of 122K Prepared by Excimer Laser Ablation", Jpn. J. Appl. Phys. vol. 29, No. 10, Oct. 1990, pp. L1813-L1815.

Ichikawa et al, "Highly Oriented Superconducting Tl-Ca-Ba-Cu Oxide Thin Films with 2-1-2-2 Phase", Appl. Phys. Lett. 53(10) Sep. 1988 pp. 919-921.

Lee et al, "Superconducting Tl-Ca-Ba-Cu-O Thin Films with Zero Resistance at Temperatures of up to 120K", Appl. Phys. Lett. 53(4) Jul. 1988 pp. 329-331.

A. Tanaka et al., "Pb-doped Bi-Sr-Ca-Cu-O thin films," Appl. Phys. Lett., vol. 54, No. 14, Apr. 3, 1989, pp. 1362-1364.

A. Tanaka et al., "Composition dependence of high $T_c$ phase formation in Pb-doped Bi-Sr-Ca-Cu-O thin films," Appl. Phys. Lett., vol. 55, No. 12, Sep. 18, 1989, pp. 1252-1254.

Primary Examiner—Roy V. King
Attorney, Agent, or Firm—Staas & Halsey

[57] ABSTRACT

In an oxide superconducting film wiring, when the line width is reduced, the evaporation of a component during firing becomes so vigorous that it becomes impossible to form a desired single crystal phase, which causes a significant lowering in the properties of the oxide superconducting wiring. This problem can be solved by preventing the evaporation of the evaporable component during the firing. Examples of this include a process wherein plate is placed above the superconductor forming material film wiring pattern on the substrate so as to face each other, the plate comprising a material having no chemical influence on the superconducting wiring, and a pattern of a material containing an evaporable component is arbitrarily formed, a process wherein a pattern having a smaller line width is sandwiched between patterns having a larger line width, and a process wherein the firing atmosphere or the concentration of the evaporable component in the pattern is varied depending upon the line width.

39 Claims, 15 Drawing Sheets

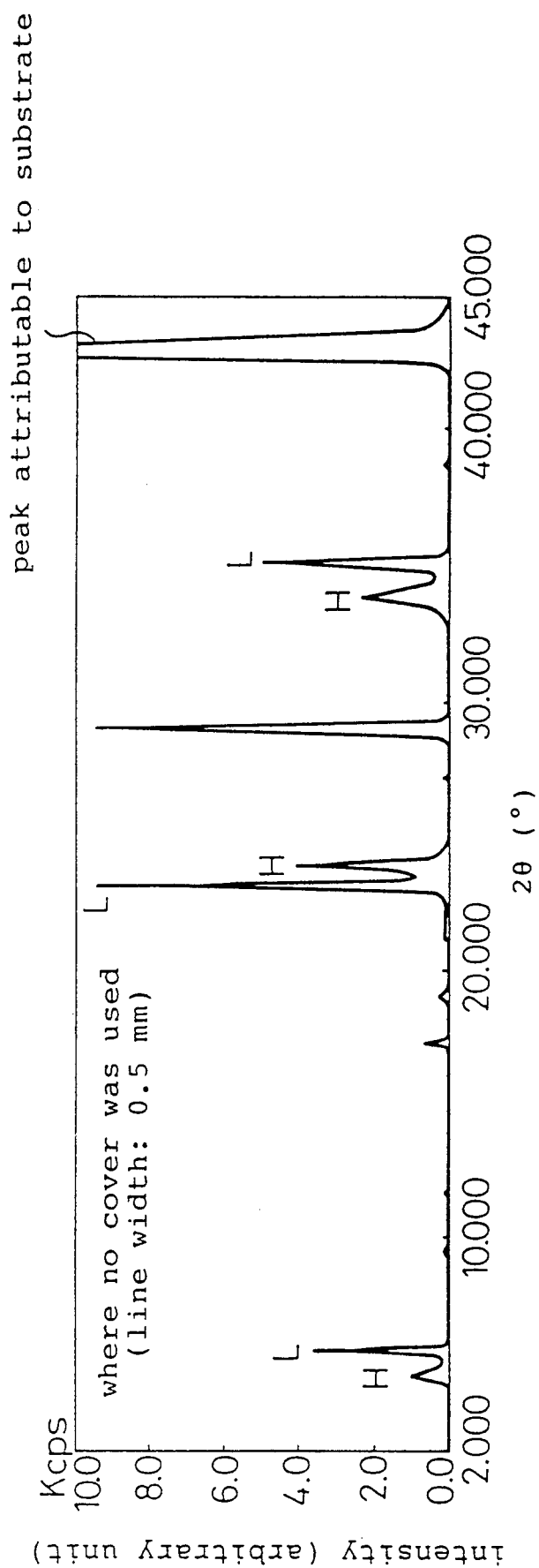

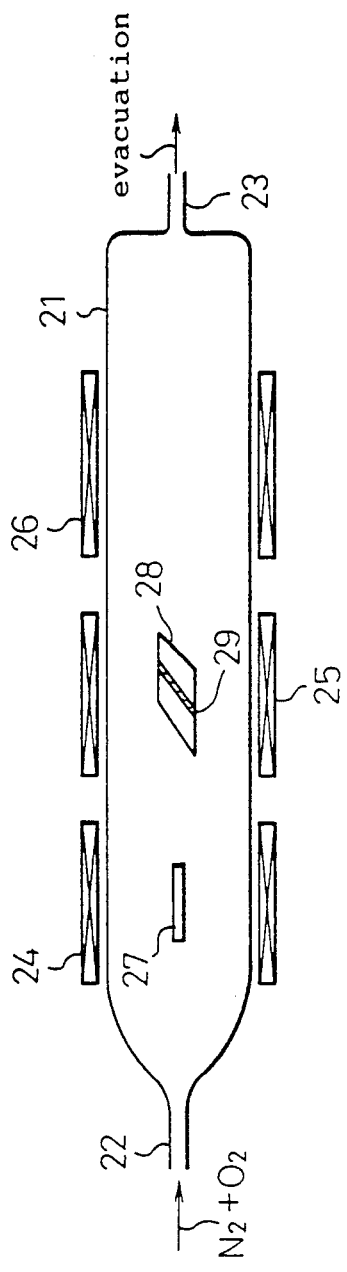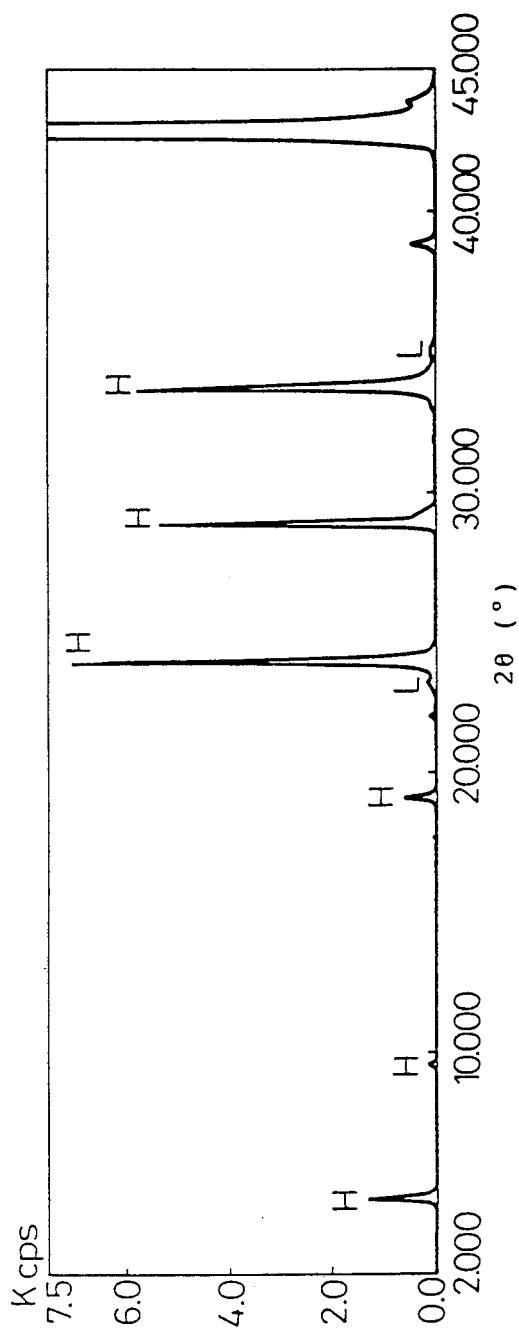

feed of atmosphere gas evacuation signal layer surface ground plane layer surface

PROCESS FOR PRODUCING BI- AND PB-CONTAINING OXIDE SUPERCONDUCTING WIRING FILMS

BACKGROUND OF THE INVENTION

The present invention relates to a superconducting film, and more particularly, to a process for producing a film of a bismuth based perovskite superconducting material containing lead.

A superconducting film wiring currently practicable in the art is a Bi-base superconducting film wiring.

Examples of the Bi-base superconducting film wiring realizable in the art include that comprising a 10 K phase having a superconducting transition temperature, i.e., a critical temperature, Tc, of 10 K at which a normal conducting phase is transferred to a superconducting phase, that comprising a 80 K phase having a critical temperature, Tc, of 80 K, and that comprising a 110 K phase having a critical temperature, Tc, of 110 K, but it is known in the art that it is very difficult to prepare a Bi-based superconducting film wiring of a 110 K phase.

In the superconductor field, however, since a high superconducting transition temperature greatly benefits the cooling, such as a reduction of size of the whole equipment through a simplification of a cooling device, a Bi-based superconducting wiring of a 110 K phase is required.

DESCRIPTION OF THE RELATED ART

In general, a Bi-based superconducting film has been produced by depositing a material film on a substrate by sputtering, vacuum evaporation or the like and subjecting the material film to a post-heat treatment to synthesize a superconducting film. In this case, the patterning is usually conducted either by using a mask in the deposition of the superconducting material film or by conducting etching after the deposition.

A very precise control of the temperature is necessary for producing a Bi-based superconducting film comprising a 110 K phase, and the formation of a single phase of a 110 K phase without the addition of Pb to the composition has been regarded as very difficult. As the present inventors have already reported (see "Appl. Phys. Lett., 54", pp. 1362–1364 (1989)), however, since Pb vigorously evaporates during sintering, the amount of Pb becomes insufficient even in the case of a film having wide pattern width, and thus it is not easy to form a Bi-based superconducting film comprising a 110 K phased.

The present inventors have succeeded in forming a Bi-based superconducting film having a single phase of a 110 K phase by adding Pb in a considerably higher concentration than that in the case of a bulk or the like (see "Appl. Phys. Lett., 55", pp. 1252–1254 (1989)).

In general, in a Bi-based superconducting film, there exists a superconducting phase wherein the critical temperature, Tc, varies depending upon the difference in the number of Cu-O planes contained in the unit cell. At the present time, in the Bi-based superconducting film represented by the formula $Bi_2Sr_2Ca_{n-1}Cu_nO_x$, three superconducting compounds are known, i.e., a phase having a Tc of 10 K wherein n is 1, a phase having a Tc of 80 K wherein n is 2, and a phase having a Tc of 110 K wherein n is 3.

The synthesis of a superconducting film comprising a 110 K phase having the highest critical temperature, Tc, is expected from the practical viewpoint, but as described above, even in the case of a film having a width pattern width, the Pb vigorously evaporates during sintering and reached a state such that the amount of Pb becomes insufficient. For this reason, a technique wherein a large amount of Pb is added has been developed. In this case, however, it has been found that the evaporation of Pb becomes more vigorous in the case of a pattern having a small line width, so that the proportion of the formation of the 110 K phase is decreased. When a larger amount of Pb is added to a pattern having a small line width, the superconducting material film partially melts during sintering to form a 110 K phase. The partial melting temperature is closely related to the proportion of Pb. Specifically, when the proportion of Pb is high, the superconducting material film unfavorably melts at a low temperature of about 840° C. and the melting becomes vigorous. This is liable to cause variations in the composition from place to place, and consequently, a Tc phase or a crystal having a small grain diameter is often formed, and thus the texture becomes heterogeneous. This causes the critical current density, Jc, and the critical temperature, Tc, to be lowered, and thus favorable results can not be obtained.

Accordingly, an object of the present invention is to form a substantially single phase of a 110 K phase through the prevention of an evaporation of a large amount of an evaporable component such as Pb in an early stage of the firing and formation of a heterogeneous texture by the use of a very simple technique in the firing of a film having a smaller width pattern of a Bi-based superconducting material containing Pb.

SUMMARY OF THE INVENTION

To attain the above-described object, the present invention provides a process for producing a superconducting film, comprising the steps of: forming on a substrate a film wiring pattern of a material capable of producing a superconducting material upon being fired; and firing the wiring pattern of the superconductor forming material film while preventing or compensating for the evaporation of an evaporable component (hereinafter referred to as "easily evaporable component").

The term "superconductor forming material" is intended to mean a material capable of becoming a superconducting material upon being fired and is an aspect including a superconducting material per se.

The specific means for preventing or compensating for the evaporation of the easily evaporable component of the superconducting material may be, for example, a first, to arrange a plate above a superconductor forming material film wiring pattern on a substrate so as to face each other, the plate comprising a material having no chemical influence on the superconducting wiring;

second, to form a film of a material containing an easily evaporable component (hereinafter referred to as "material containing an easily evaporable component") on the surface of the plate into a pattern, preferably a pattern corresponding to a superconductor forming material film wiring pattern;

third, to form a film pattern of a material containing an easily evaporable component in a larger width than that of the superconductor forming material film wiring pattern along and on both sides of the superconductor forming material film wiring pattern on the substrate;

fourth, to place a material containing an easily evaporable component within a firing oven for firing a superconductor forming material film wiring pattern;

fifth, to feed a vapor of an easily evaporable component within the firing oven for firing the superconductor forming material film wiring pattern;

sixth, to separate a wiring pattern of a superconductor forming material film into a wiring portion having a larger pattern width and a wiring portion having a smaller pattern width, and placing the wiring portion having a larger pattern width and the wiring portion having a smaller pattern width in a different firing atmosphere; or seventh, to differentiate the concentration of the easily evaporable component in the wiring portion having a larger pattern width from that of the wiring portion having a smaller pattern width in the wiring pattern of the superconductor forming material film, so that the concentration of the easily evaporable component in the wiring portion having a smaller pattern width is higher than that in the wiring portion having a larger pattern width.

In a preferred embodiment, the superconducting material is a Bi-Pb-Sr-Ca-Cu-O-base perovskite superconducting material, and the easily evaporable component is Pb. In this case, the superconductor forming material is a Bi-Pb-Sr-Ca-Cu-O-base material comprising Bi, Pb, Sr, Ca and Cu in a Bi:Pb:Sr:Ca:Cu molar ratio of preferably (1.9 to 2.1):(1.2 to 2.2):2:(1.9 to 2.2):(3 to 3.5), more preferably (1.9 to 2.1):(1.5 to 1.8):2:(1.9 to 2.2):(3 to 3.5). The general composition of the Bi-Pb-Sr-Ca-Cu-O-base perovskite superconducting material thus prepared is represented by the formula $(Bi_{1-x}Pb_x)_2(Sr_{1-y}Ca_y)_4Cu_3O_z$ wherein $0<x<1$, $0<y<1$ and $0<z$.

In the present invention, a particularly large effect can be attained when the wiring width is 1 mm or less, more preferably 0.5 mm, most preferably 0.3 mm. Although the present invention can be applied to both a thin film and a thick film, a larger effect can be attained particularly when the film is a thin film.

BRIEF DESCRIPTION OF THE DRAWINGS

FIGS. 5A, 5B and 5C are X-ray diffraction patterns of samples of the present invention and comparative samples prepared in Example 1;

FIG. 12 is a cross-sectional view of a firing oven used in Example 5;

FIG. 13 is an X-ray diffraction pattern of a sample prepared in Example 5;

DESCRIPTION OF THE PREFERRED EMBODIMENTS

Figure 1:
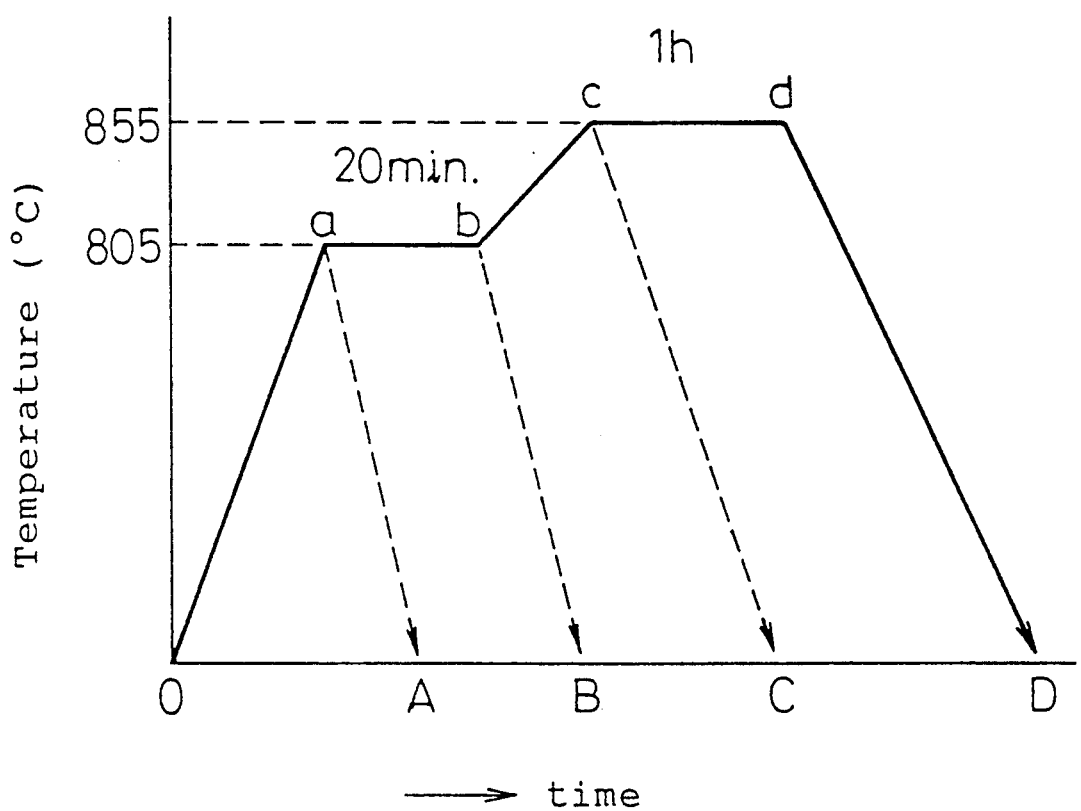
FIG. 1 is a firing temperature profile of a Bi-Pb-Sr-Ca-Cu-O-base perovskite superconducting material.

An oxide superconducting film having a critical temperature of 100 K or above can be formed by any of the thick film method and the thin film method, but when the line width is about 1.0 mm or less, it becomes difficult to form the 110 K phase as a single phase and the 80 K phase as well is present, so that the critical temperature is rapidly lowered. In this case, the material often exhibits no superconducting state even at a liquid nitrogen temperature (77 K) The present inventors consider that the reason why it becomes difficult to form the 110 K phase when the line width is reduced resides in the evaporation of a component having a particularly high vapor pressure, among the components constituting the superconductor.

Specifically, with respect to a Bi-Pb-Sr-Ca-Cu-O-based material which the present inventors have studied for practical use, a component having a particularly high vapor pressure, and having a great influence on the properties is PbO, which exhibits the relationship between the temperature and the vapor pressure as shown in Table 1.

TABLE 1

| Temperature (°C.) | Vapor pressure (Torr) |
|---|---|
| about 680 | $1 \times 10^{-2}$ |
| about 750 | $1 \times 10^{-1}$ |
| about 930 | $1 \times 10^{0}$ |
| about 1100 | $1 \times 10^{1}$ |
| 1470 (b.p.) | 760 (1 atm) |

Since the temperature at which firing is conducted for crystallization to form a superconducting phase is about 850° C., the vapor pressure of PbO is so high that an evaporation easily occurs at this stage.

In particular, the reason why it becomes difficult to form the 110 K phase as a single phase in a small pattern width in question is believed to be because, since the partial pressure of PbO attributable to the evaporation from the periphery including the PbO itself decreases with a reduction in the line width, the evaporation of the component is not inhibited and the exposed surface area per unit volume becomes large, which causes the amount of evaporation of PbO to become large.

Accordingly, in the present invention, a 110 K phase is formed as a substantially single phase even in a small line width, through the prevention or compensation for the evaporation of particularly PbO during firing, to thereby produce an oxide superconducting film having a high critical temperature.

The first means for preventing the evaporation of an easily evaporable component is to spatially limit the firing atmosphere around the wiring portion. Specifically, a plate (a substrate) of a material having no chemical influence on a superconducting film, for example, MgO, $Al_2O_3$, $LaAlO_3$, sapphire, $SrTiO_3$, $ZrO_2$ (including a stabilized or partially stabilized element), $LaGaO_3$, $MgAl_2O_4$, $Y_2O_3$, $SiO_2$, $2MgO.SiO_2$, Si, $MgO.SiO_2$ or a quartz glass is disposed so as to face a substrate having a wiring pattern of a superconductor forming material formed thereon. The gap between the wiring pattern on the wiring substrate and the counter plate (counter substrate) is preferably narrow, and is generally 1 mm or less, preferably about 0.5 mm.

The second means is to form a pattern of a material containing an easily evaporable component on the counter substrate. This enables the vapor pressure of the easily evaporable component from the superconducting wiring pattern limited by the counter substrate to be maintained at a high level such that the evaporation of the easily evaporable component from the wiring pattern of the superconductor forming material film is further prevented. Further, when the counter substrate having this pattern formed thereon is heated to a temperature equal to or above the temperature of the substrate on which a superconducting wiring pattern is to be formed, the evaporation of the easily evaporable component from the counter substrate is accelerated. In this case as well, the gap between the wiring substrate and the pattern of the counter plate is preferably as narrow as possible, i.e., preferably 1 mm or less, more preferably about 0.5 mm.

The pattern of the material containing an easily evaporable component may be formed on the whole surface of the counter substrate. In a preferred embodiment, however, preferably the configuration of the pattern corresponds to the superconducting wiring pattern fired. This is because, in the formation of a multilayer structure etc., preferably that no excess evaporated component is deposited on a portion other than the superconducting wiring pattern of the substrate. Further, the evaporated component might accumulate within the oven, to thus make it impossible to control the atmosphere in the oven. In this sense, said first means is preferred because no deposit occurs on the counter substrate, and there is no pattern of a material containing an easily evaporable component.

The material containing an easily evaporable component for forming a pattern on the counter substrate may be a material comprising the same component or composition as that of the superconducting wiring material. For example, in the case of a Bi-Pb-Sr-Ca-Cu-O-based superconductor, use is made of a Bi-Pb-Sr-Ca-Cu-O-based material. In the Bi-Pb-Sr-Ca-Cu-O-based superconductor, the easily evaporable components are Bi, Pb, Cu, etc. In this case, Pb is particularly evaporable, and at the same time, plays an important role in the formation of a 110 K phase.

In the case of a thick film having a thickness of 20 $\mu$m or more, when a printed wiring pattern of a superconductor forming film is fired, if the material is maintained for a short time at a temperature above a predetermined firing temperature to an extent such that the evaporation of PbO does not vigorously occur and the temperature is returned to the predetermined firing temperature to conduct firing, the growth of a crystal grain is accelerated, and a dense film having no gap in the grain boundary can be obtained.

The third means is that when a wiring pattern of a superconductor forming material film is formed on a substrate, a pattern of a material containing an easily evaporable component, the line width of the wiring pattern being larger than that of the wiring pattern of the superconductor forming material film, is formed along and both sides of the wiring pattern of the superconductor forming material film. Specifically, when the line width of a superconductor wiring pattern is 1 mm or less, particularly 0.5 mm or less, it becomes difficult to form a 110 K phase. On both sides of such a narrow wiring pattern of a superconductor forming film is provided a pattern of a material containing an easily evaporable component in a larger line width than that of the wiring pattern of the superconductor forming material film, generally 1 mm or more, for example, 2 mm or more, further 3 mm or more, while leaving a gap of preferably 1 mm or less, more preferably 0.5 mm or less between the narrow wiring pattern of a superconductor forming film and the pattern of the material containing an easily evaporable component.

Since the pattern of a material containing an easily evaporable component is formed on the same substrate as that of the wiring pattern of the superconductor forming material film, it is preferred that an identical composition be used for the material containing an easily evaporable component and the superconductor forming material, and the film formation and the patterning for the material containing an easily evaporable component be conducted simultaneously with the film formation and the patterning for the superconductor forming material. In this case, since both the patterns formed by the firing comprise a superconducting film, a device may be made on the superconducting wiring pattern so that a pattern having a larger line width (for example, a ground line) is disposed on both sides of a pattern having a smaller line width (for example, a signal wiring), thus causing the larger wiring pattering provided on both sides of the smaller wiring pattern to be left in the final product. Since, however, the superconducting wiring is used in applications such as a high electron mobility transistor (HEMT) and a circuit wherein use is made of a Josephson element, when an excess pattern exists in close vicinity of the line at the time of transmission of a radio frequency signal, the excess pattern exhibits the same function as that of the earth and lowers the quality of a signal. Therefore, such an excess pattern should be removed. The excess pattern can be removed by wet etching (with an aqueous solution of hydrochloric acid, phosphoric acid or the like) or dry etching (a reactive ion etching or the like).

The fourth means is to feed a vapor of an easily evaporable component into a firing oven or to place a material containing an easily evaporable component (in the form of a pellet or the like) within a firing oven to feed a vapor of the material containing an easily evaporable component into the firing atmosphere.

The fifth means comprises dividing the superconducting wiring pattern into a wiring portion having a larger line width and a wiring portion having a smaller line width and firing the wiring portion having a larger line width in an atmosphere different from that used in the firing of the wiring portion having a smaller line width. Since the wiring layer having a larger line width and the wiring layer having a smaller line width are fired in respective separate atmospheres, it is possible to select respective firing atmospheres so that the amounts of evaporation of high vapor pressure components in respective wiring layer compositions become substantially equal to each other. This enables the compositions of the respective wiring layers after the firing to be coincided with each other, and predetermined superconducting properties to be simultaneously obtained in all wiring layers.

For example, the wiring portion having a larger line width and the wiring portion having a small line width may be separated from each other in an identical firing chamber by means of a partitioning member to make the atmospheres of the two wiring portions different from each other. The following method is particularly convenient. A wiring portion having a larger line width is formed on one principal surface of a substrate, and a wiring portion having a smaller line width is formed on the other principal surface of the substrate. The substrate is held on a through hole provided on a member for partitioning the firing chamber into two regions. Both sides of the substrate are respectively exposed to the two regions on both sides of the partition, and the through hole is hermetically sealed by the substrate, thus enabling the atmospheres of the two regions to be made different from each other.

The sixth means is to differentiate the concentration of the easily evaporable component in the wiring portion having a larger line width from that of the easily evaporable component in the wiring portion having a smaller line width, so that the concentration of the easily evaporable component of the wiring portion having a smaller line width becomes higher. That is, the concentration of the evaporable component is previously regulated depending upon the line width or the evaporability. In this case, when the superconductor is a Bi-Pb-Sr-Ca-Cu-O-based superconductor, the Pb/Bi molar ratio is preferably from 0.6 to 1.0 in any of the wiring patterns to be fired.

An experiment was conducted on how the Pb concentration of a Bi-Pb-Sr-Ca-Cu-O-based superconductor wiring pattern changes with the wiring width during the firing and the confirmation of the formed phase at that time.

A Bi-Pb-Sr-Ca-Cu-O layer was deposited on a MgO single crystal substrate by RF magnetron sputtering and fired to form a $Bi_2Sr_2Ca_2Cu_3O_x$ oxide superconductor wiring. In a deposit composition comprising Bi, Pb, Sr, Ca and Cu in a molar ratio of 1.0:0.9:1.0:1.0:1.7, a whole ground plane layer having a size of 10 mm × 10 mm and a signal layer having a line width of 1 mm were deposited, and firing was conducted according to a temperature profile shown in FIG. 1. In FIG. 1, the OdD is a temperature profile used in the actual firing. In this case, the temperature is raised from room temperature to 805° C., maintained at that temperature for 20 min, further raised to 855° C., maintained at that temperature for one hour and lowered to room temperature. The OaA, ObB and OcC are each a temperature profile wherein the firing is discontinued without continuation to the final stage. The firing was conducted in the air. After the firing, the film was subjected to measurement of an X-ray diffraction and analysis of the composition.

Figure 2A:
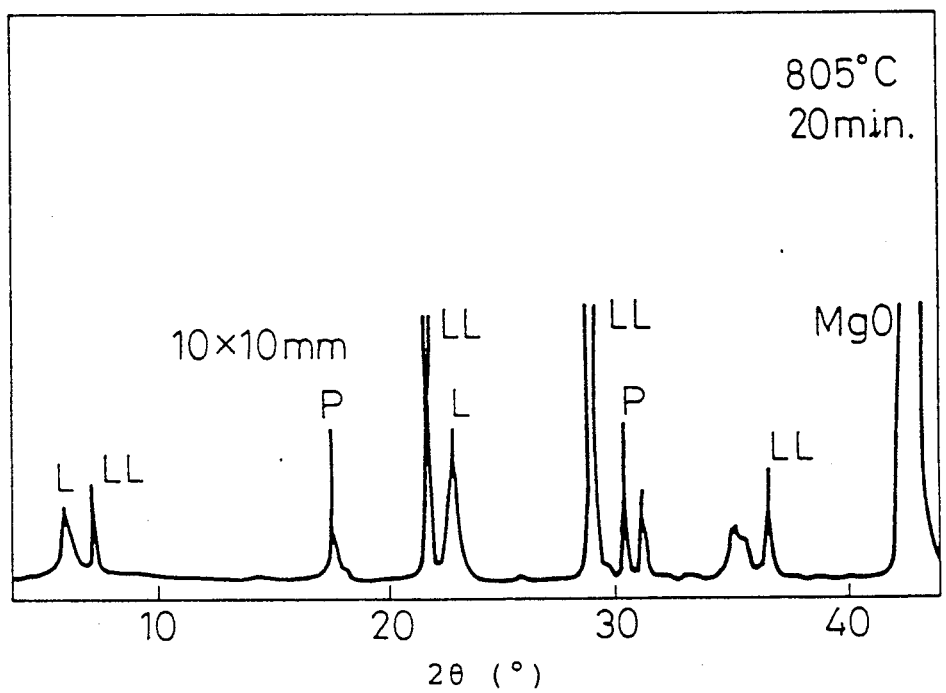
FIGS. 2A and 2B are X-ray diffraction patterns of samples fired according to the temperature profile OabB shown in FIG. 1.
Figure 2B:
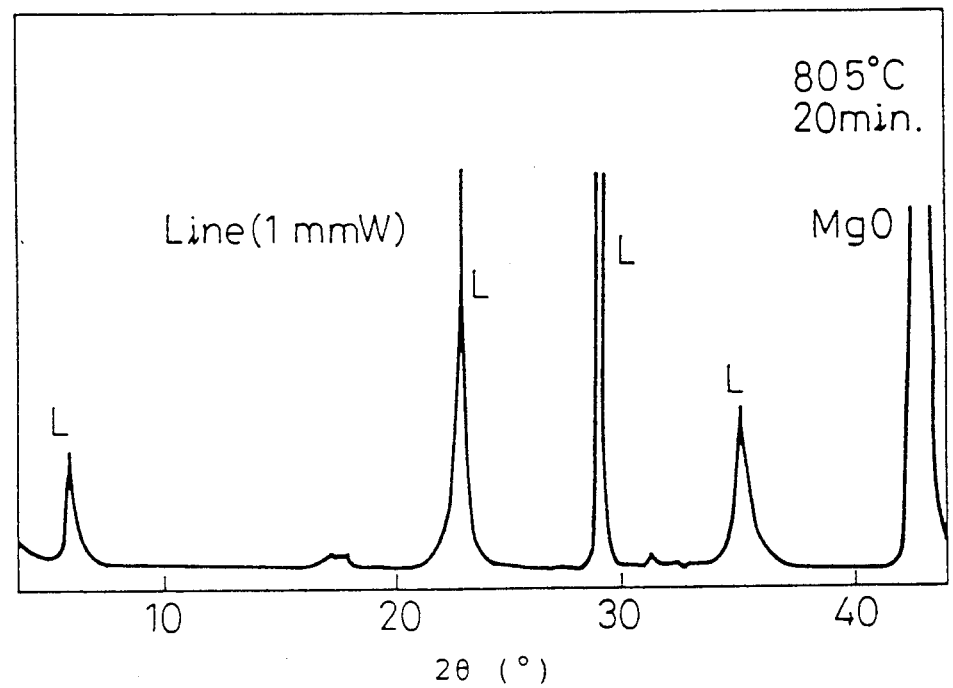

The X-ray diffraction patterns of samples fired according to the profile OabB are shown in FIGS. 2A and 2B. In the drawings, L, LL and P respectively represent peaks attributable to a 80 K phase, a 10 K phase and $Ca_2PbO_x$. As shown in FIG. 2A, in a ground plane layer sample having a size of 10 mm × 10 mm, a strong peak attributable to $Ca_2PbO_x$ is observed, whereas as shown in FIG. 2B, in a signal layer sample having a line width of 1 mm, a peak attributable to $Ca_2PbO_x$ is very weak.

Figure 3:
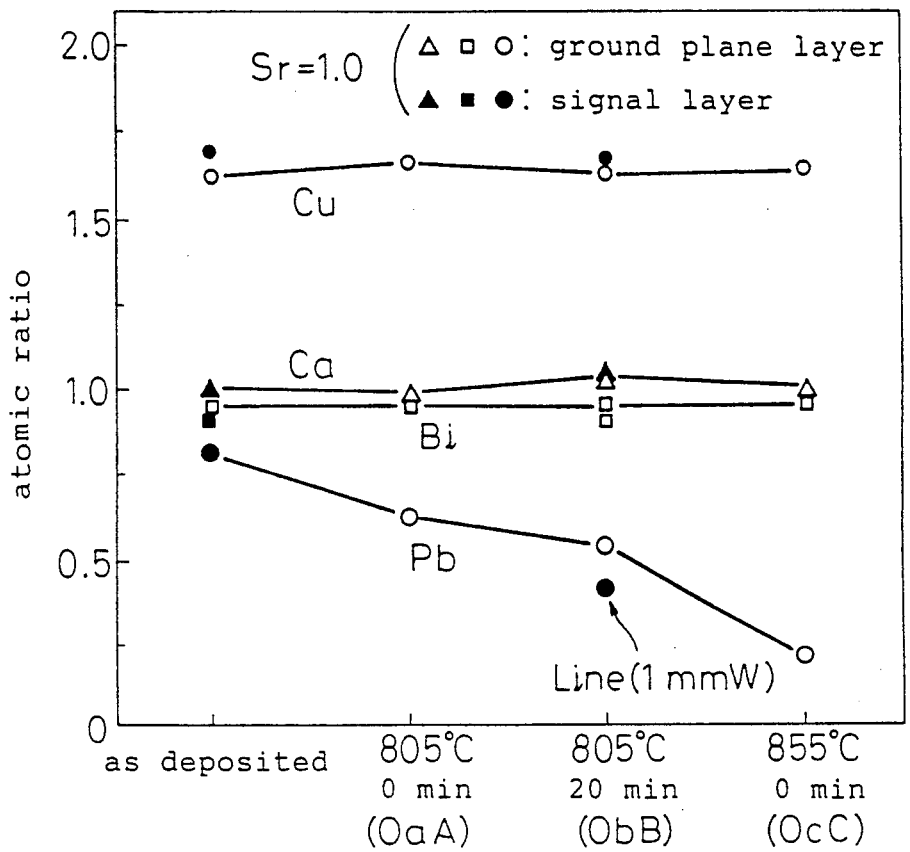
FIG. 3 is a diagram showing a change in composition in the step of firing a material (a ground plane layer and a signal layer) fired according to a temperature profile shown in FIG. 1.

The results of the analysis of the composition conducted in each stage of the firing with respect to a sample of a ground plane layer and a sample of a signal layer are shown in FIG. 3. In both cases, the relative concentration of each component is plotted by taking the concentration of Sr concentration as 1. The Bi, Cu and Ca concentrations are substantially constant from the deposited state through each stage of the firing. On the other hand, it is apparent that the Pb concentration decreases with the advance of the firing. In particular, in samples fired according to the temperature profile OabB corresponding to FIGS. 2A and 2B, the signal layer having a smaller width (line width: 1 mm) exhibits a more rapid reduction in the Pb concentration than the ground plane layer (10 mm × 10 mm) having a larger width ■●▲: signal layer, □○△: ground plane layer).

Figure 4:
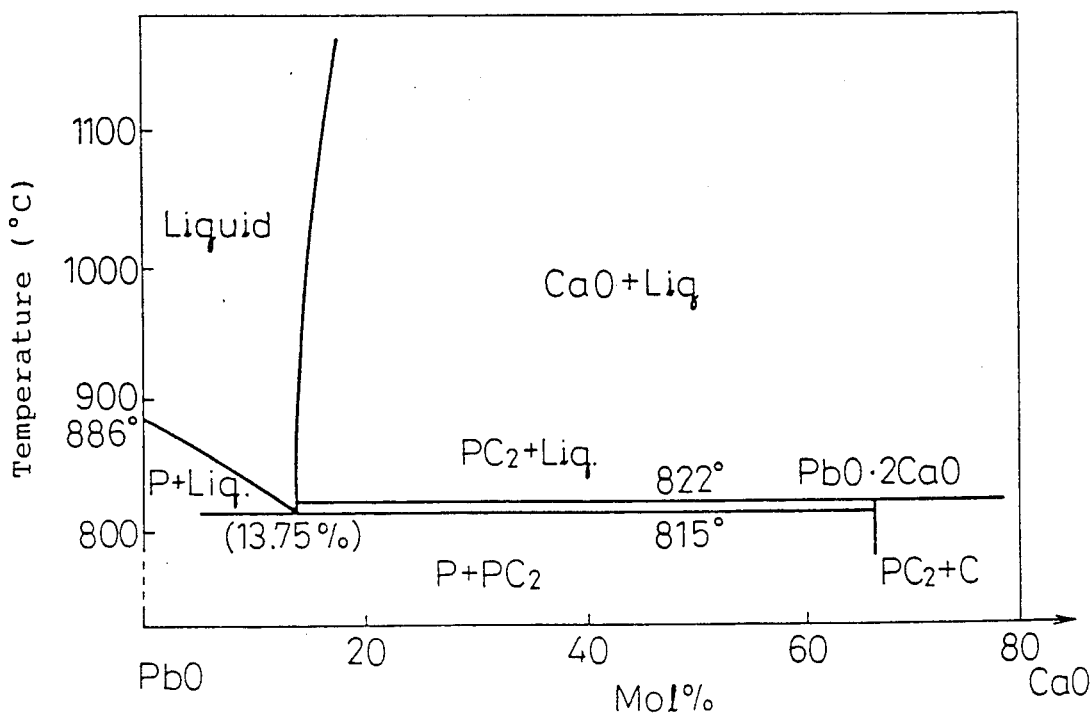
FIG. 4 is a quasi-binary equilibrium phase diagram of PbO-CaO.

FIG. 4 is a quasi binary equilibrium phase diagram of PbO-CaO, and it is apparent that when the concentration ratio of PbO to CaO is larger than 1:2, partial melting occurs at 815° C., and accordingly, it is expected that, in more a complicated Bi-Pb-Sr-Ca-Cu-O-based superconductor also, the melting occurs at least partially at a temperature equivalent to or below that temperature. Therefore, it is substantially certain that melting occurs when a large amount of PbO stays within the film in the course of the temperature rise from 805° C. to 855° C. according to the actual firing temperature profile OabcdD shown in FIG. 1 and the holding of the temperature at 855° C.

EXAMPLE 1

A superconductor forming material was deposited by radio-frequency magnetron sputtering on a MgO single crystal substrate covered with a metal mask having a linear pattern, to form a superconductor forming material film pattern having a line width of 0.5 mm (500 μm) and a thickness of 0.8 μm and comprising Bi, Pb, Sr, Ca and Cu in a ratio of 1.0:0.8:1.0:1.0:1.6.

Then, the substrate having a superconductor forming material film formed thereon was fired in the air at 850° C. for one hour to form a Bi-based perovskite superconducting film.

In the firing, as Example 1, (a) a MgO substrate was covered with a FGA (fine grained alumina) plate and the distance between the MgO plate and the FGA plate was set to about 1 mm, and as comparative examples, (b) firing was conducted in a state such that the distance between the FGA plate and the MgO substrate was set to about 5 mm, and (c) no FGA plate was used.

Figure 5A:
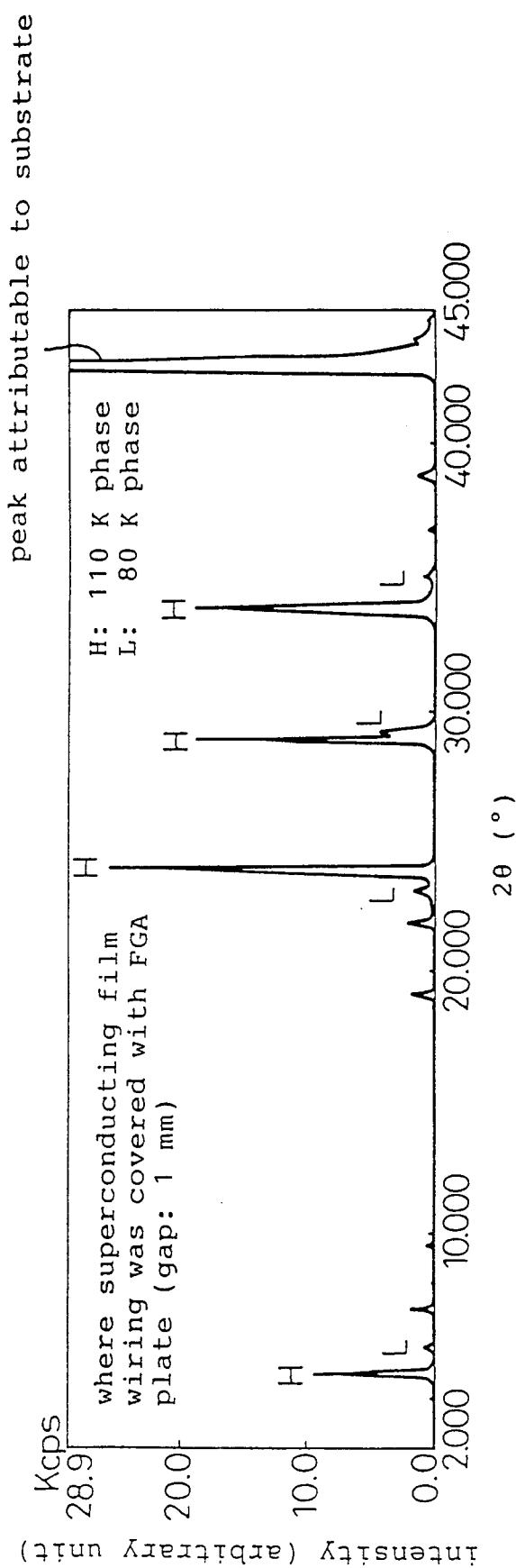
Figure 5B:
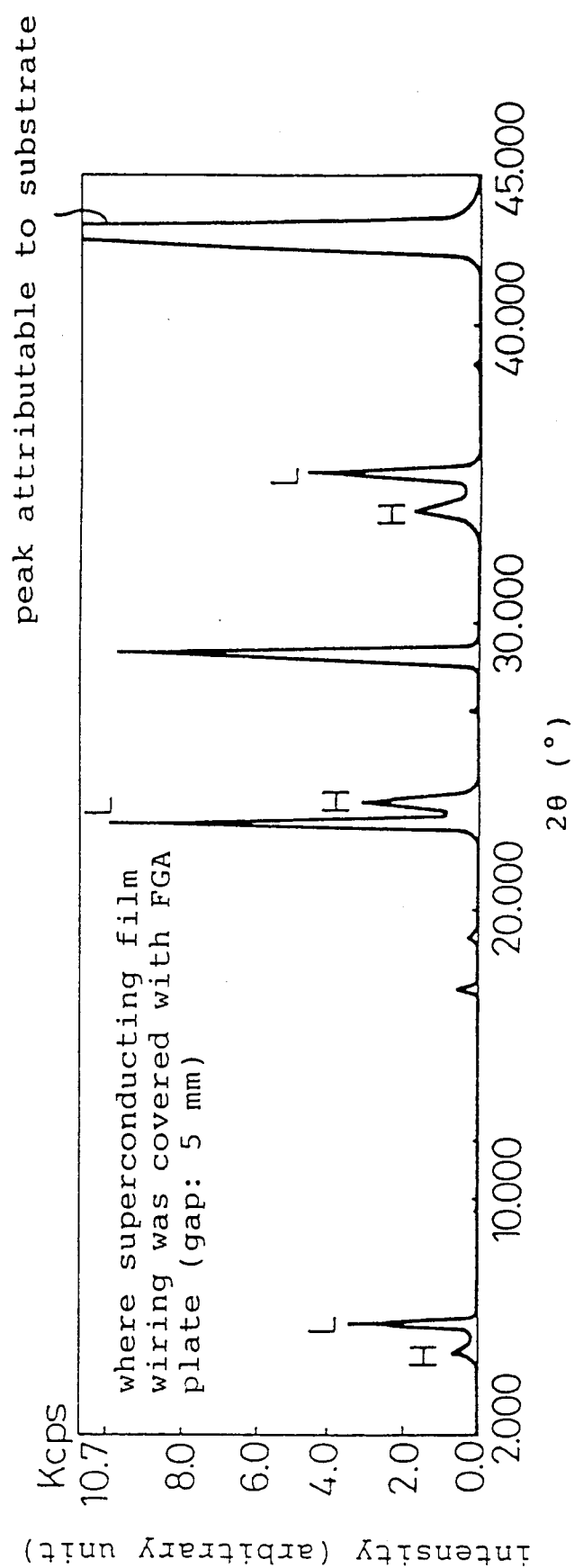

The X-ray diffraction patterns determined on samples (a), (b) and (c) thus prepared are respectively shown in FIGS. 5A, 5B and 5C. In these diagrams, H and L represent a 110 K phase and an 80 K phase, respectively.

From FIG. 5A, it is apparent that main peaks in the X-ray diffraction pattern of the sample (a) are H, i.e., attributable to the 110 K phase. On the other hand, from FIGS. 5B and 5C, it is apparent that main peaks in the X-ray diffraction patterns of the samples (b) and (c) are L, i.e., attributable to the 80 K phase.

Figure 6:
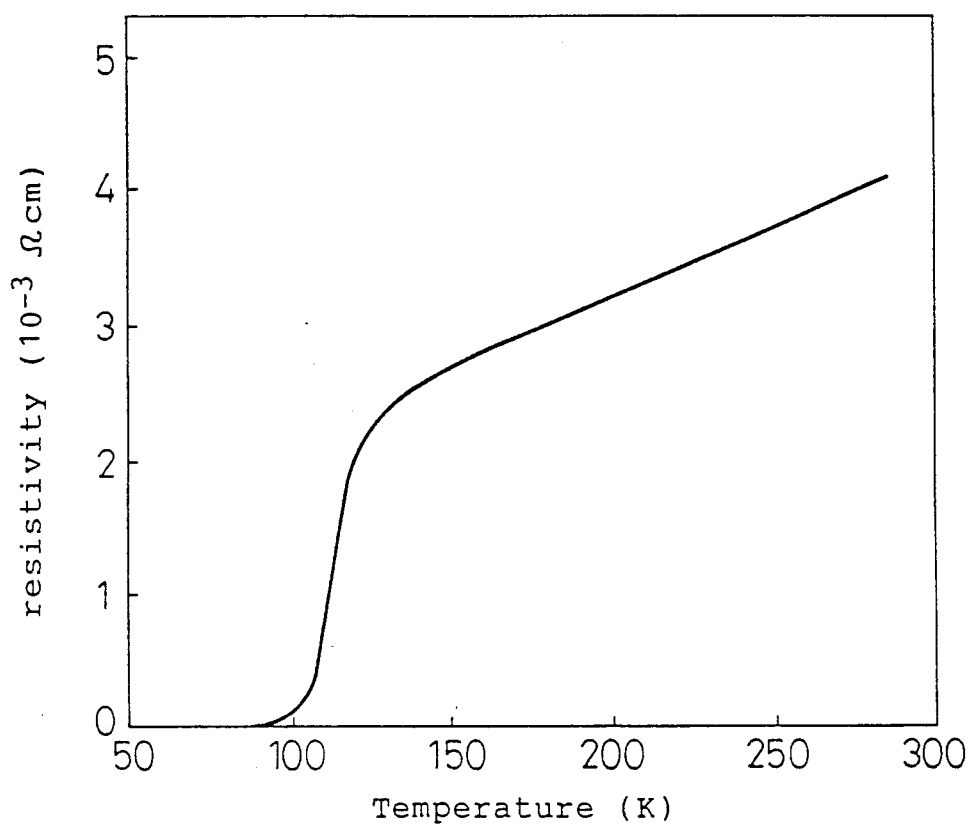
FIG. 6 is a diagram showing a change of the electrical resistance with the temperature for a sample prepared in Example 1.

FIG. 6 is a graph showing a change of electrical resistivity with temperature in a superconducting film wiring having a line width of 0.5 mm prepared by firing under the same condition as that used in the preparation of the sample (a). In FIG. 6, the abscissa represents the temperature and the ordinate represents the electrical resistivity value.

From FIG. 6, it is apparent that the critical temperature is 97 K, i.e., substantially the same as that in the case of a superconducting film wiring provided with a pattern having a large line width of 1 mm or more.

The critical current density at the liquid nitrogen temperature was $2 \times 10^3$ A/cm$^2$, i.e., sufficiently large.

EXAMPLE 1 (EXAMPLE OF THICK FILM)

Raw material powders of $Bi_2O_3$, PbO, $SrCO_3$, $CaCO_3$ and CuO were prepared and mixed with each other so that the molar ratio of Bi:Pb:Sr:Ca:Cu was 0.7:0.3:1:1:1.8. The mixed powder was fired at 845° C. for 150 hr to prepare a Bi-Pb-Sr-Ca-Cu-O-based oxide superconductor.

The oxide superconductor was coarsely ground in a mortar and then subjected to regulation of the grain size in a ball mill. Terpineol was added as a viscosity modifier to the powder, and the mixture was kneaded with acetone as a solvent. The kneaded product was dried to remove acetone, and benzene was mixed with the dried product. The mixture was dried to regulate the viscosity to prepare a superconducting paste.

A plurality of sheets of a magnesia single crystal substrate having a size of 15 mm square and a thickness of 0.5 mm were provided, and a line pattern having a line width of 0.5 mm and a length of 10 mm was printed by screen printing through the use of this paste.

Figure 7:
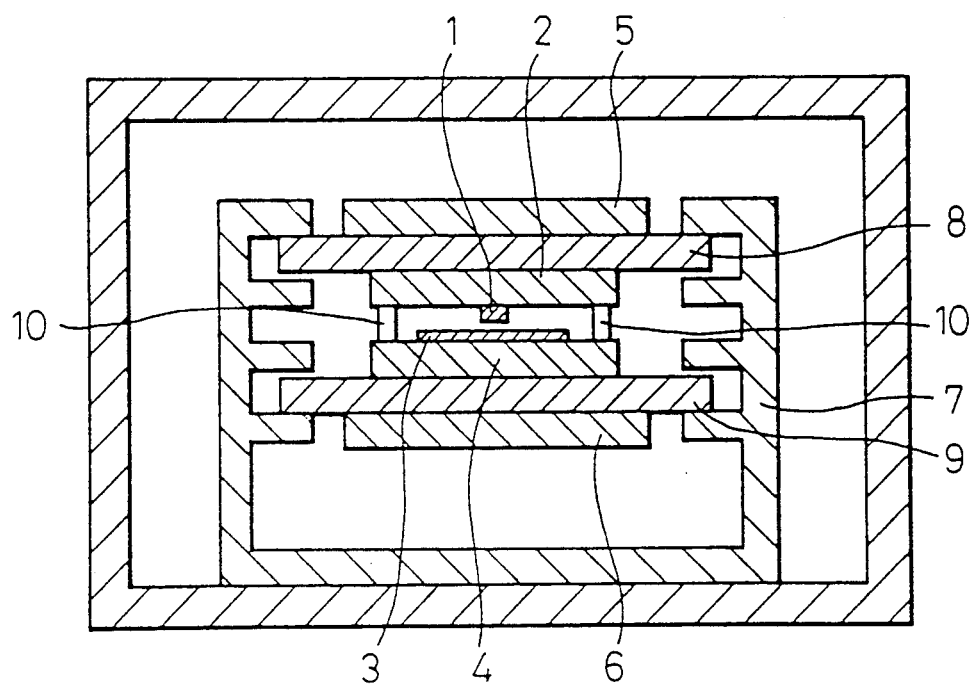
FIG. 7 is a cross-sectional view of a firing oven used in Example 2.

Then, a firing oven shown in FIG. 7 was provided. Specifically, alumina plates 8,9 respectively provided with heaters 5,6 at the back thereof were mounted on a frame 7 comprising a quartz glass, and substrates 2,4 were placed opposite each other on the ceramic plates 8,9 though the use of a magnesia spacer 10. The substrate 2 is a substrate for forming a superconducting wiring, and the substrate 4 is a substrate having a pattern for preventing the evaporation of PbO from the superconducting wiring. Thus, the gap between the wiring pattern 1 and the counter pattern 3 was kept at 0.5 mm.

Two sheets of a magnesia substrate having, printed thereon, a conductor line having a line width of 0.5 mm, a thickness of 30 μm and a length of 10 mm were mounted in a firing oven shown in FIG. 7 and placed opposite to each other at a space of 0.5 mm therebetween, and the upper substrate was used as a wiring pattern.

In the air, heaters 5,6 were energized, the two substrates were heated at 860° C. for 10 min, and the temperature of the upper substrate 2 was lowered to 840° C. with the temperature of the lower substrate 4 being kept at 850° C. for 6 hr to conduct firing.

Figure 8:
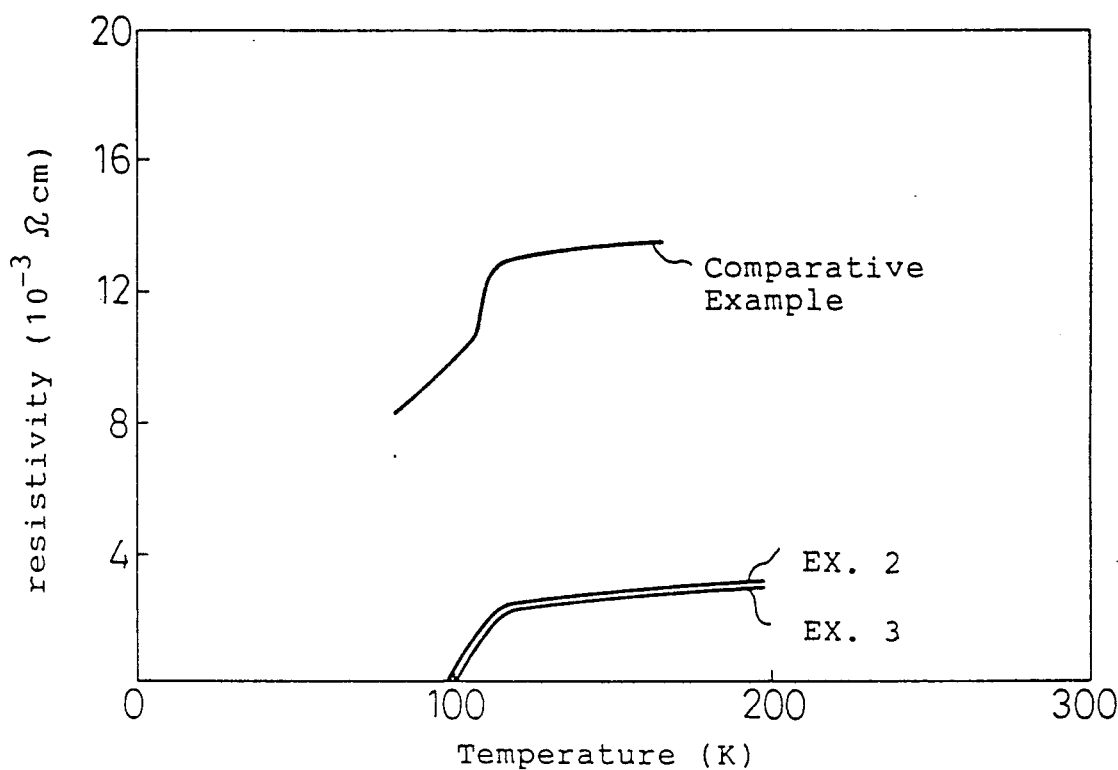
FIG. 8 is a diagram showing a change of the electrical resistivity with the temperature for a sample prepared in Example 2.

The resultant conductor line (superconducting phase) of the upper substrate 2 was subjected to a measurement of the temperature dependence of the electrical resistivity thereof. The results are shown in FIG. 8. The critical temperature was about 98 K.

For comparison, the above-described procedure was repeated. Specifically, raw material powders of $Bi_2O_3$, PbO, $SrCO_3$, $CaCO_3$ and CuO were prepared and mixed with each other so that the molar ratio of Bi:Pb:Sr:Ca:Cu was 0.7:0.3:1:1:1.8. The mixed powder was fired at 845° C. for 150 hr to prepare a Bi-Pb-Sr-Ca-Cu-O-based oxide superconductor.

The oxide superconductor was coarsely ground in a mortar and then subjected to a regulation of the grain size in a ball mill. Terpineol was added as a viscosity modifier to the powder, and the mixture was kneaded with acetone as a solvent. The kneaded product was dried to remove acetone, and benzene was mixed with the dried product. The mixture was dried to regulate the viscosity to prepare a superconducting paste.

A line pattern having a line width of 1 mm was printed by screen printing through the use of this paste, and dried. In the air, the printed and dried substrate was heated to 860° C. for 10 min, lowered to 245° C. and fired at that temperature for 6 hr. The temperature dependence of the resistivity measured on the line pattern of this sample is also given in FIG. 8, which clearly demonstrates the effect of the present invention.

EXAMPLE 3 (EXAMPLE OF THICK FILM)

The procedure of Example 2 was repeated, except that a line pattern having a line width of 0.5 mm and a length of 10 mm was formed on one magnesia single crystal substrate and a pattern having a size of 10 mm square was formed on another magnesia single crystal substrate by screen printing. The magnesia substrate having printed thereon a line pattern having a line width of 0.5 mm, a thickness of 30 μm and a length of 10 mm was mounted on the upper part of the firing oven, while the magnesia substrate having, printed thereon, a solid pattern having a size of 10 mm square and a thickness of 30 μm was mounted on the lower part of the firing oven.

The firing was conducted in the same manner as that of Example 2. The resultant conductor line pattern (superconducting phase) was subjected to a measurement of the temperature dependence of the resistivity. The results are shown in FIG. 8. The critical temperature was about 100 K.

EXAMPLE 4

Figure 9:
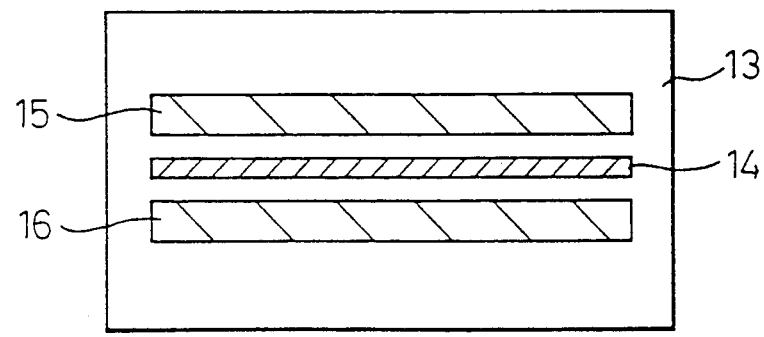
FIG. 9 is a wiring pattern of a sample prepared in Example 4.

As shown in FIG. 9, a 1 μm-thick thin film of an oxide having a composition ratio of Bi:Pb:Sr:Ca:Cu of 1.0:0.8:1.0:1.0:1.6 was formed on a magnesia single crystal substrate 13 by radio-frequency magnetron sputtering through the use of a metal mask. On both sides of a line 14 having line widths of 0.5 mm (500 μm) and 1 mm were provided patterns 15,16 each having a line width of 3 mm while leaving a gap of 0.5 mm (500 μm) between the line 14 and each pattern.

This substrate was fired in the air at 855° C. for one hour to form a superconducting phase.

Figure 10A:
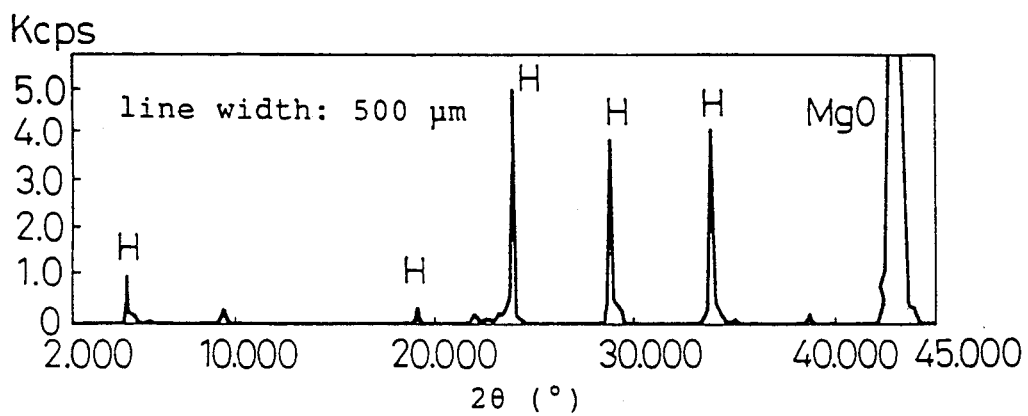
FIGS. 10A and 10B are X-ray diffraction patterns of samples prepared in Example 4.
Figure 10B:
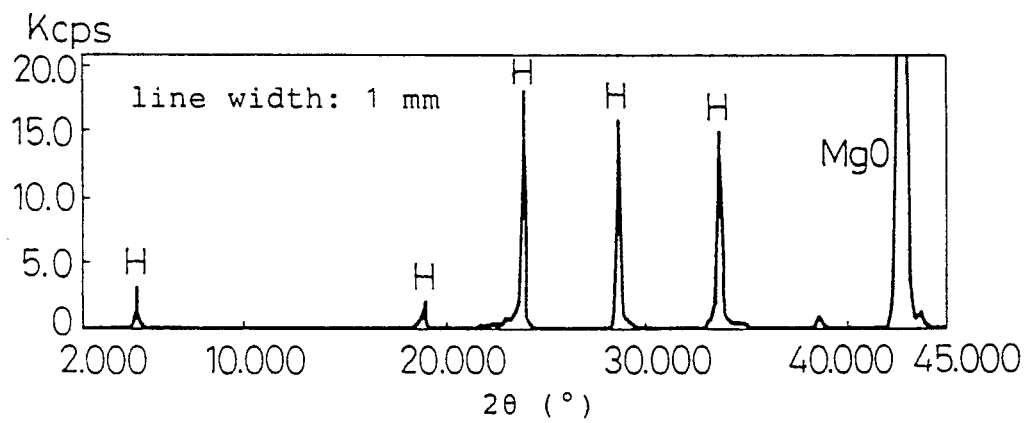

X-ray diffraction patterns measured on the resultant lines respectively having line widths of 0.5 mm and 1 mm are shown in FIGS. 10A and 10B. In these drawings also, H and L represent a 110 K phase and an 80 K phase, respectively.

As can be seen from these drawings, main peaks in the X-diffraction patterns are attributable to the 110 K phase.

Figure 11:
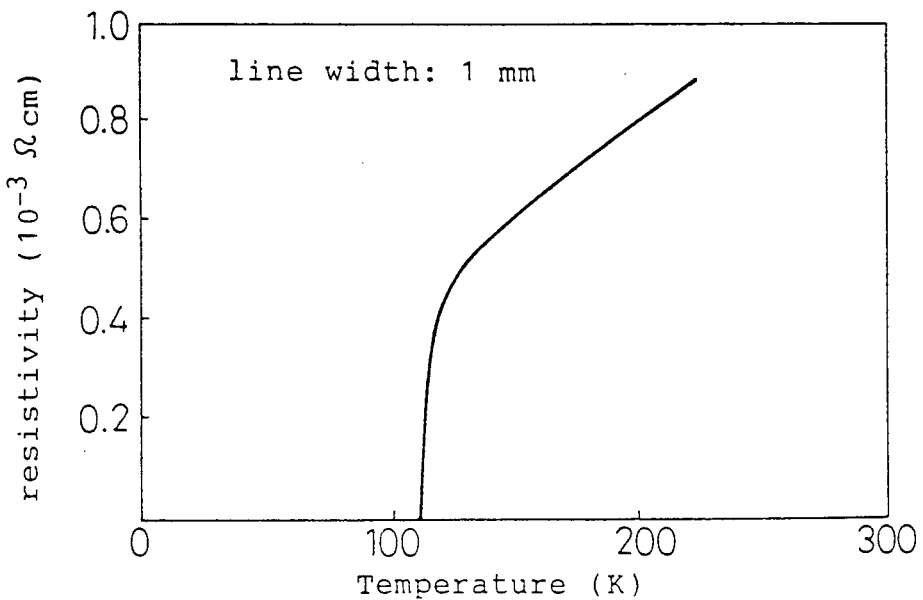
FIG. 11 is a diagram showing a change of the electrical resistivity with the temperature for a sample prepared in Example 4.

The results of measurement of the temperature dependence of the resistivity on a line having a line width of 1 mm are shown in FIG. 11. The critical temperature was 107 K, which was exactly the same as that in the case of a line having a large line width.

The critical current density at liquid nitrogen atmosphere was sufficiently large and $4 \times 10^3$ A/cm$^2$.

The results where the line width was 0.5 mm and the patterns 15,16 were not formed on both sides of the line are as shown as Comparative Example in Example 1. Specifically, as shown in FIG. 5C, main peaks were attributable to an 80 K phase. The measurement of the temperature dependence of the resistivity has revealed that, although the resistivity rapidly decreased around 110 K, the temperature at which the resistance became zero (0) was as low as 78 K. Further, at liquid nitrogen temperature, the superconducting state was broken by a small amount of current.

EXAMPLE 5

In this example, firing was conducted through the use of a tubular oven as shown in FIG. 12. In the drawing, numeral 21 designates a tubular firing chamber, numeral 22 a gas feeding pipe, numeral 23 an evacuation pipe, numeral 24 a first heater, numeral 25 a second heater, numeral 26 a third heater, numeral 27 a Bi-Pb-Sr-Ca-Cu-O pellet, and numeral 28 a substrate having, formed thereon, a wiring pattern 29 of a superconductor forming material. This tubular oven is usually called a "three zone tubular oven" and has three zones which can be independently subjected to regulation of the temperature respectively by three pairs of heaters (the first heater 24, the second heater 25 and the third heater 26).

In this firing oven, a magnesia single crystal substrate 28 having the same superconductor forming material film pattern 29 [line width: 0.5 mm (500 μm)] as that prepared in Example 1 was mounted.

A mixed gas (O$_2$+N$_2$) was fed at a flow rate of 5 liters/min into the tubular firing chamber 21 through the gas feed pipe 22, and the setting was conducted so that the temperature of the substrate 28 became 850° C. during firing. An oxide pellet 27 having a diameter of 30 mm and a height of 2 mm and containing Bi, Pb, Sr, Ca and Cu in a molar ratio of 1:1:1:1:1.5 was placed in the first zone corresponding to the first heater 24, and the temperature of the first zone was set to 800° C.

Under the above setting conditions, the vapor pressure of PbO around the substrate 28 was enhanced to about $10^{-5}$ Torr.

As can be seen from FIG. 13 showing an X-ray diffraction pattern of the resultant sample, a superconducting wiring composed mainly of a 110 K phase was formed even in a small line width by firing under the above conditions.

EXAMPLE 6

Bi-Pb-Sr-Ca-Cu-O was subjected to RF magnetron sputtering to deposit a 1 μm-thick ground plane layer having a size of 10 mm × 10 mm on one principal surface of a MgO substrate. A metal mask was applied to the other principal surface of the MgO substrate, and deposition was conducted in the same manner as that described above to deposit a 1 μm-thick signal layer having a width of 0.5 mm (500 μm).

Both the above depositions were conducted at a substrate temperature of 350° C. so as to form a deposit having such a composition that the Bi:Pb:Sr:Ca:Cu molar ratio was 1.0:0.6:1.0:1.0:1.6.

Figure 14A:
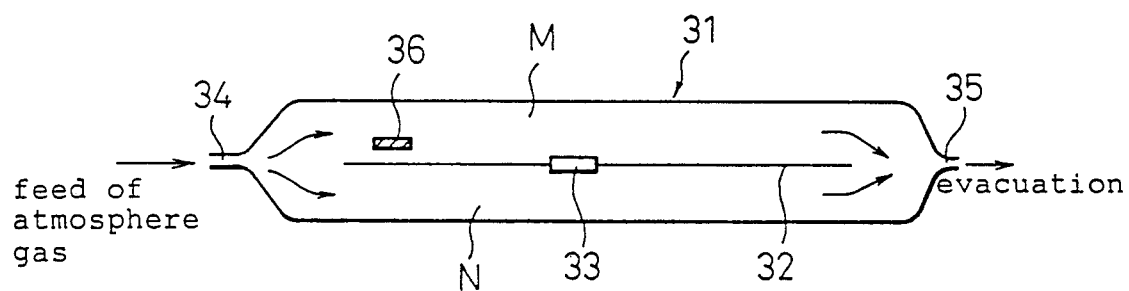
FIGS. 14A and 14B are respectively a cross sectional view of a firing oven used in Example 6 and an enlarged view of a substrate holding portion of the firing oven shown in FIG. 14A.
Figure 14B:
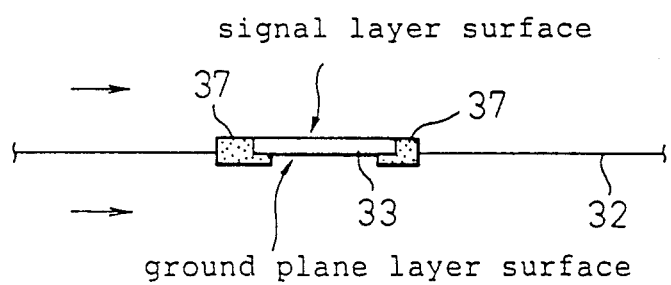

The deposit layers were then fired. The tubular oven used in the firing and a substrate holding portion of the oven are respectively shown in FIG. 14A and 14B.

The tubular oven 31 comprises a quartz glass. The inside of the firing chamber is partitioned into two regions, that is, upper and lower regions (M, N), by means of a partitioning plate 32 comprising a quartz glass, and a substrate 33 is held in substantially a central portion of the partitioning plate 32. The substrate holding portion has an opening passing through the thickness, and the edge of the opening was prepared in the form of a ring alumina substrate receiver 37 provided with a flange. The outer edge of the substrate 33 was put and held on the flange of the substrate receiver 37, and the outer edge of the substrate and the flange were brought into close contact with each other to block the opening to separate the two regions, i.e., upper and lower regions (M, N), from each other. A gas for a firing atmosphere was introduced through a gas flow inlet 34 provided at the left end of the tubular oven 31, and evacuation was conducted through a gas flow outlet 35 provided at the right end of the tubular oven. A Bi-Pb-Sr-Ca-Cu-O pellet 36 having a Bi:Pb:Sr:Ca:Cu ratio of 1.0:1.0:1.0:1.0:1.5 was placed upstream of the position holding the substrate 33 in the upper region M, and a suitable amount of PbO was fed into an atmosphere gas flow from the flow inlet 34.

The MgO substrate 33 was held in a substrate holding portion of the partitioning plate 32 within the tubular oven 31 in such a manner that the surface having a signal layer deposited thereon faced upward and the surface having a ground plane layer deposited thereon faced downward. A mixed gas (N$_2$+O$_2$) (flow ratio N$_2$:O$_2$=4:1, total flow rate=5 liters/min) was fed through the gas flow inlet 34. Firing was conducted according to a firing temperature profile OabcdD (805° C.×20 min 805° C.×1 hr) shown in FIG. 1.

Figure 15A:
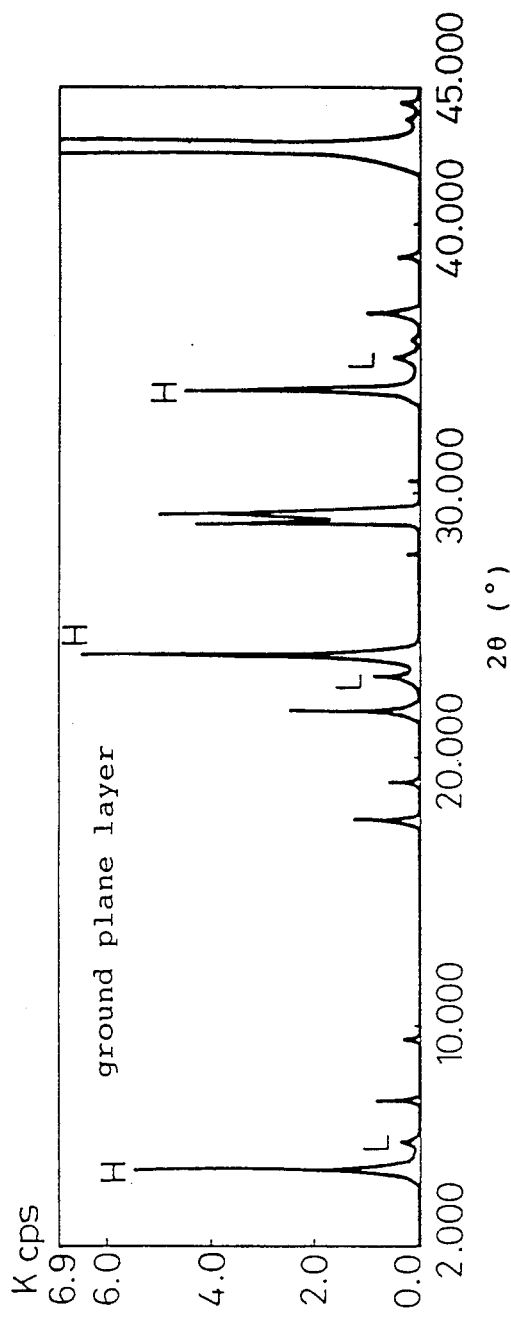
FIGS. 15A and 15B are X-ray diffraction patterns of samples prepared in Example 6.
Figure 15B:
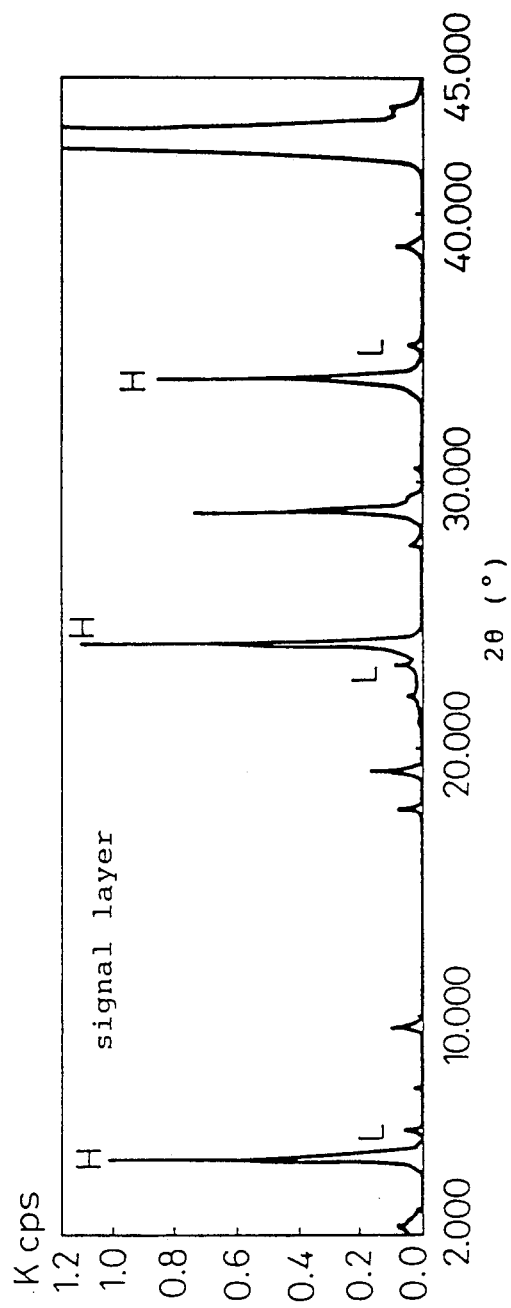

After firing, the substrate 33 was taken out of the tubular oven 31 and subjected to X ray diffraction. The results are shown in FIGS. 15A and 15B. In the drawings, H and L represents a 110 K phase and an 80 K phase, respectively. From the results, it is apparent that the ground plane layer (FIG. 15A) and the signal layer (FIG. 15B) in the film after the firing each consist essentially of a single phase of the 110 K phase.

Figure 16:
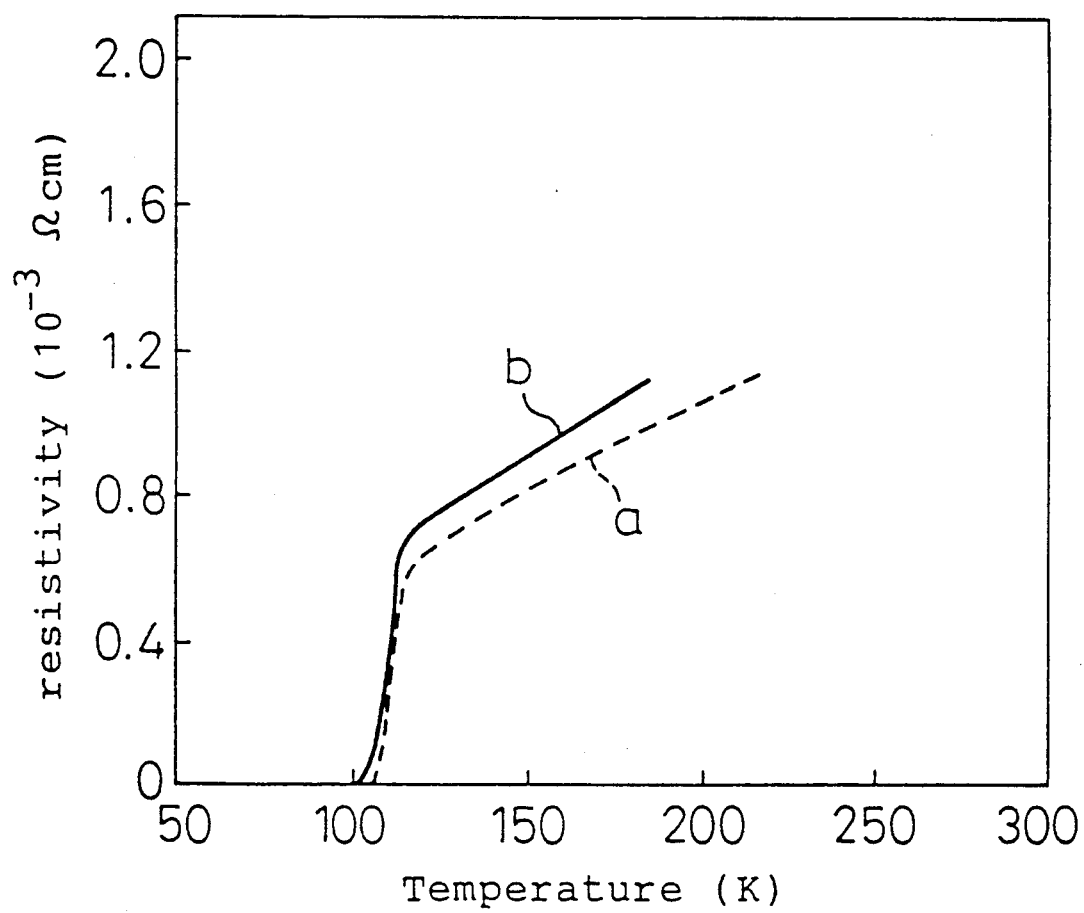
FIG. 16 is a diagram showing a change of the electrical resistivity with the temperature for a sample prepared in Example 6.

The resultant individual wiring layers were subjected to measurement of a change of the electrical resistance with the temperature, and the results are shown in FIG. 16. The critical temperature, Tc, of the ground plane layer (a) was exactly same as that of the signal layer (b) and 100 K. In both wiring layers, the critical current density at liquid nitrogen temperature was $4 \times 10^3$ A/cm$^2$, i.e., satisfactory from the viewpoint of practical use.

EXAMPLE 7

A ground plane layer having a size of 10 mm × 10 mm was deposited on a MgO substrate by RF magnetron sputtering. A metal mask was applied to the opposite surface of the MgO substrate, and deposition was conducted in the same manner as that described above to deposit a signal layer having a width of 0.5 mm (500 μm) was deposited.

Both of the above depositions were conducted at a substrate temperature of 350° C. so as to form a deposit having such a composition that the Bi:Pb:Sr:Ca:Cu ratio was 1.0:0.6:1.0:1.0:1.6 in the case of the ground plane layer and 1.0:0.8:1.0:1.0:1.6 in the case of the signal layer. That is, the Pb concentration of the signal layer was higher than that of the ground plane layer.

The deposit layers were then fired. The firing was conducted within a conventional quartz tubular oven through the use of a mixed gas ($N_2+O_2$) (flow ratio $N_2:O_2=4:1$, total flow rate=5 liters/min) as a firing atmosphere according to a firing temperature profile OabcdD (805° C.×20 min+855° C.×1 hr) shown in FIG. 1.

Figure 17A:
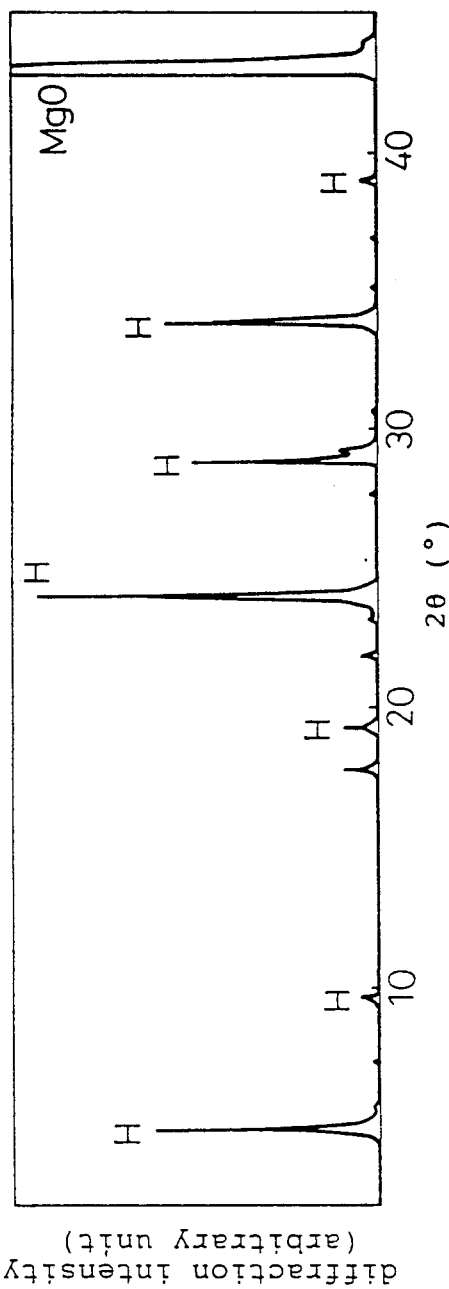
FIGS. 17A and 17B are X-ray diffraction patterns of samples prepared in Example 7.
Figure 17B:
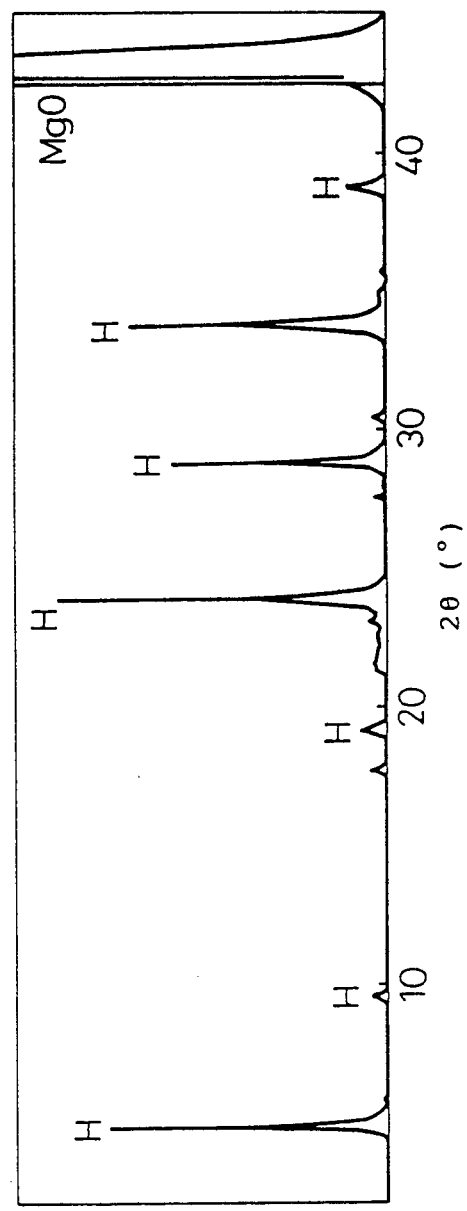

After the firing, the substrate was taken out of the tubular oven and subjected to X ray diffraction measurement. The results are shown in FIGS. 17A and 17B. In the drawings, H represents a diffraction peak attributable to a 110 K phase. From the results, it is apparent that the ground plane layer (FIG. 17A) and the signal layer (FIG. 17B) in the film after the firing each consist essentially of a single phase of the 110 K phase.

Figure 18:
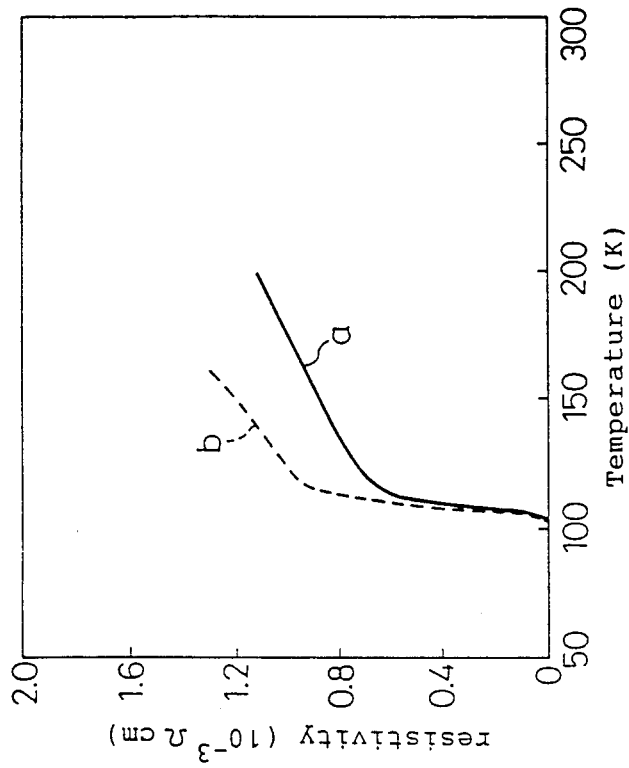
FIG. 18 is a diagram showing a change of the electrical resistivity with the temperature for a sample prepared in Example 7.

The resultant individual wiring layers were subjected to measurement of a change of the electrical resistivity with the temperature, and the results are shown in FIG. 18. The critical temperature, Tc, of the ground plane layer (a) was exactly the same as that of the signal layer (b) and 100 K. In both wiring layers, the critical current density at liquid nitrogen temperature was $1 \times 10^4$ $A/cm^2$, i.e., satisfactory from the viewpoint of practical use.

Figure 19:
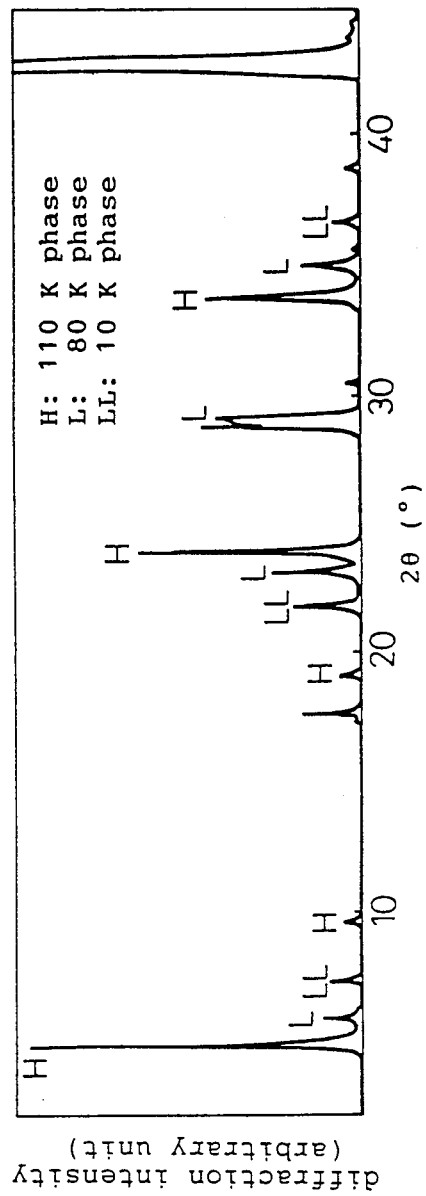
FIG. 19 is an X-ray diffraction pattern of a comparative sample prepared in Example 7.

For comparison, wiring layers was formed in the same manner as that of the above Example, except that both the ground plane layer and the signal layer had a deposit composition having a Bi:Pb:Sr:Ca:Cu ratio of 1.0:0.8:1.0:1.0:1.6. The resultant wiring layers were subjected to X-ray diffraction. The results of the X-ray diffraction on the ground plane layer are shown in FIG. 19. In the drawing, H, L and LL represent diffraction peaks attributable to a 110 K phase, an 80 K phase and a 10 K phase. It is apparent that the Pb concentration during the deposition of the ground plane layer was so high that the 80 K phase and the 10 K phase were present as well as the 110 K phase.

According to the present invention, it is possible to form an oxide superconducting wiring having a high critical temperature, particularly a Bi-Pb-Sr-Ca-Cu-O based oxide superconducting wiring rich in a 110 K phase even when the line width is small, which renders the oxide superconducting wiring formed by the present invention useful as a high-temperature superconducting wiring used at liquid nitrogen temperature in high electron mobility transistors, Josephson elements, etc.

We claim:

1. A process for producing a superconducting wiring film, comprising the steps of:
    forming on a substrate a film wiring pattern of a material capable of producing a Pb- and Bi-containing oxide superconducting material upon being fired; and
    firing the superconductor forming material film wiring pattern while preventing or compensating for the evaporation of at least one of Pb and Bi components of the superconducting material,
    wherein the means for preventing or compensating for the evaporation of the at least one of Pb and Bi components of the superconducting material is to place above and close to the superconductor forming material film wiring pattern on the substrate so that the plate and the superconductor forming material film wiring pattern face each other, the plate comprising a material having no chemical influence on the superconductor forming material film wiring pattern.

2. A process according to claim 1, wherein the material of the plate is selected from a group consisting of $Al_2O_3$, $LaAlO_3$, MgO, sapphire, $SrTiO_3$, $ZrO_2$, $LaGaO_3$, $MgAl_2O_4$, $Y_2O_3$, $SiO_2$, $2MgO.SiO_2$, Si, $MgO.SiO_2$ and a quartz glass.

3. A process according to claim 1, wherein a film of a material containing the at least one of Pb and Bi components of the superconducting material is formed on the surface facing the superconductor forming material film wiring pattern of said plate.

4. A process according to claim 3, wherein the film of a material containing the at least one of Pb and Bi components of the superconducting material is formed in a pattern corresponding to the superconductor forming material film wiring pattern.

5. A process according to claim 3, wherein firing is conducted while maintaining the film of a material containing the at least one of Pb and Bi components of the superconducting material at a temperature equal to ore above the temperature of the superconductor forming material film wiring pattern.

6. A process according to claim 3, wherein the superconducting material is a Bi-Pb-Sr-Ca-Cu-O-based perovskite superconducting material and the at least one of Pb and Bi components of the superconducting material is Pb.

7. A process according to claim 6, wherein the material containing the at least one of Pb and Bi components of the superconducting material is a Bi-Pb-Sr-Ca-Cu-O-based material.

8. A process according to claim 1, wherein a gap between the superconductor forming material film wiring pattern and the plate is 1 mm or less.

9. A process according to claim 8, wherein the gap between the superconductor forming material film wiring pattern and the plate is 0.5 mm or less.

10. A process according to claim 3, wherein a gap between the superconductor forming material film wiring pattern and the film of a material containing the at least one of Pb and Bi components of the superconducting material is 1 mm or less.

11. A process according to claim 10, wherein the gap between the superconductor forming material film wiring pattern and the film of a material containing the at least one of Pb and Bi components of the superconducting material is 0.5 mm of less.

12. A process according to claim 1, wherein a line width of the superconductor forming material film wiring pattern is 1 mm or less.

13. A process according to claim 12, wherein the line width of the superconductor forming material film wiring pattern is 0.3 mm or less.

14. A process according to claim 1 wherein the superconducting material is a Bi-Pb-Sr-Ca-Cu-O-based perovskite superconducting material and the at least one of Pb and Bi components of the superconducting material is Pb.

15. A process according to claim 14, wherein the superconducting material is a Bi-Pb-Sr-Ca-Cu-O-based material containing Bi, Pb, Sr, Ca and Cu in a Bi:Pb:Sr:Ca:Cu molar ratio of (1.9 to 2.1):(1.2 to 2.2):2:(1.9 to 2.2):(3to 3.5).

16. A process according to claim 15, wherein the superconducting material is a Bi-Pb-Sr-Ca-Cu-O-based material containing Bi, Pb, Sr, Ca and Cu in a Bi:Pb:Sr- :Ca:Cu molar ratio of (1.9 to 2.1):(1.5 to 1.8):2:(1.9 to 2.2):(3 to 3.5).

17. A process for producing a superconducting wiring film, comprising the steps of:
   forming a substrate a film wiring pattern of a material capable of producing a Pb- and Bi-containing oxide superconducting material upon being fired; and
   firing the superconductor forming material film wiring pattern while preventing or compensating for the evaporation of at least one of Pb and Bi components of the superconducting material,
   wherein the means for preventing or compensating for the evaporation of the at least one of Pb and Bi components of the superconducting material is to form a film pattern of a material containing the at least one of Pb and Bi components of the superconducting material with a width larger than that of the superconductor forming material film wiring pattern along and on both sides of the superconductor forming material film wiring pattern on the substrate.

18. A process according to claim 17, wherein the superconducting material is a Bi-Pb-Sr-Ca-Cu-O-based perovskite superconducting material and the at least one of the Pb and Bi components of the superconducting material is Pb.

19. A process according to claim 18, wherein the film pattern of a material containing the at least one of Pb and Bi components of the superconducting material is a Bi-Pb-Sr-Ca-Cu-O-based perovskite superconducting material.

20. A process according to claim 17, wherein the superconducting forming material film wiring pattern is a signal wiring layer, and the film pattern of a material containing the at least one of Pb and Bi components of the superconducting material is a ground plane layer.

21. A process according to claim 15, wherein a gap between the film pattern of a material containing the at least one of Pb and Bi components of the superconducting material is removed after the firing.

22. A process according to claim 17, wherein a gap between the superconductor forming material film wiring pattern and the film pattern of a material containing the at least one of Pb and Bi components of the superconducting material is 1 mm or less.

23. A process according to claim 21, wherein the gap between the superconductor forming material film wiring pattern and the film pattern of a material containing the at least one of Pb and Bi components of the superconducting material is 0.5 mm or less.

24. A process according to claim 17, wherein a line width of the superconductor forming material film wiring pattern is 1 mm or less.

25. A process according to claim 17, wherein the line width of the superconductor forming material film wiring pattern is 0.3 mm or less.

26. A process according to claim 18, wherein the superconducting material is a Bi-Pb-Sr-Ca-Cu-O-based material containing Bi, Pb, Sr, Ca and Cu in a Bi:Pb:Sr:Ca:Cu molar ratio of (1.9 to 2.1):(1.2 to 2.2):2:(1.9 to 2.2):(3 to 3.5).

27. A process according to claim 26, wherein the superconducting material is a Bi-Pb-Sr-Ca-Cu-O-based material containing Bi, Pb, Sr, Ca and Cu in a Bi:Pb:Sr:Ca:Cu molar ratio of (1.9 to 2.1):(1.5 to 1.8):2:(1.9 to 2.2):(3 to 3.5).

28. A process for producing a superconducting wiring film, comprising the steps of:
   forming on a substrate a film wiring pattern of a material capable of producing a Pb- and Bi-containing oxide superconducting material upon being fired; and
   firing the superconductor forming material film wiring pattern while preventing or compensating for the evaporation of at least one of Pb and Bi components of the superconducting material,
   wherein the means for preventing or compensating for the evaporation of the at least one of Pb and Bi components of the superconducting material is to divide the superconductor forming material film wiring pattern into first and second wiring portions, the first wiring portion having a line width larger than that of the second wiring portion and to fire the first wiring portion in an atmosphere different from that used in the firing of the second wiring portion.

29. A process according to claim 28, wherein the firing atmosphere in the second wiring portion has a vapor pressure higher than that of the firing atmosphere in the first wiring portion.

30. A process according to claim 28, wherein the superconducting material is a Bi-Pb-Sr-Ca-Cu-O-based perovskite superconducting material and the at least one of Pb and Bi components of the superconducting material is Pb.

31. A process according to claim 28, wherein the width of superconductor forming material film wiring pattern is 1 mm or less.

32. A process according to claim 30, wherein the superconducting material is a Bi-Pb-Sr-Ca-Cu-O-based material containing Bi, Pb, Sr, Ca and Cu in a Bi:Pb:Sr:Ca:Cu molar ratio of (1.9 to 2.1):(1.2 to 2.2):2:(1.9 to 2.2):(3 to 3.5).

33. A process according to claim 32, wherein the superconducting material is a Bi-Pb-Sr-Ca-Cu-O-based material containing Bi, Pb, Sr, Ca and Cu in a Bi:Pb:Sr:Ca:Cu molar ratio of (1.9 to 2.1):(1.5 to 1.8):2:(1.9 to 2.2):(3 to 3.5).

34. A process for producing a superconducting wiring film, comprising the steps of:
   forming on a substrate a film wiring pattern of a material capable of producing a Pb- and Bi-containing oxide superconducting material upon being fired; and
   firing the superconductor forming material film wiring pattern while preventing or compensating for the evaporation of at least one of Pb and Bi components of the superconducting material.
   wherein the means for preventing or compensating for the evaporation of the at least one of Pb and Bi components of the superconducting material is to divide the superconductor forming material film wiring pattern into first and second wiring portions, the first wiring portion having a line width larger than that of the second wiring portion and to differentiate the concentration of the at least one of Pb and Bi components of the superconducting material in the first wiring portion from that of the at least one of Pb and Bi components of the superconducting material in the second wiring portion so that the concentration of the at least one of Pb and Bi components of the superconducting material of the second wiring portion becomes higher than that of the at least one of Pb and Bi components of the superconducting material of the first wiring portion.

35. A process according to claim 34, wherein the superconducting material is a Bi-Pb-Sr-Ca-Cu-O-based perovskite superconducting material and the at least one of Pb and Bi components of the superconducting material is Pb.

36. A process according to claim 35, wherein the molar ratio of the Pb concentration to the Bi concentration of the Bi-Pb-Sr-Ca-Cu-O-based superconductor forming material film wiring pattern is in the range of from 0.6 to 1.1.

37. A process according to claim 34, wherein the width of superconductor forming material film wiring pattern is 1 mm or less.

38. A process according to claim 35, wherein the superconducting material is a Bi-Pb-Sr-Ca-Cu-O-based material containing Bi, Pb, Sr, Ca and Cu in a Bi:Pb:Sr:Ca:Cu molar ratio of (1.9 to 2.1):(1.2 to 2.2):2:(1.9 to 2.2):(3 to 3.5).

39. A process according to claim 38, wherein the superconducting material is a Bi-Pb-Sr-Ca-Cu-O-based material containing Bi, Pb, Sr, Ca and Cu in a Bi:Pb:Sr:Ca:Cu molar ratio of (1.9 to 2.1):(1.5 to 1.8):2:(1.9 to 2.2):(3 to 3.5).

* * * * *

UNITED STATES PATENT AND TRADEMARK OFFICE
CERTIFICATE OF CORRECTION

PATENT NO. : 5,312,803
DATED : May 17, 1994
INVENTOR(S) : TANAKA et al.

It is certified that error appears in the above-indentified patent and that said Letters Patent is hereby corrected as shown below:

Title Page: [56] References Cited, under FOREIGN PATENT DOCUMENTS, change the present listing to read as follows:

|  |  |  |
|---|---|---|
| 1-282105 | 11/1989 | Japan |
| 2-170311 | 7/1990 | Japan |
| 2-170478 | 7/1990 | Japan |
| 2-175613 | 7/1990 | Japan |
| 4-042584 | 2/1992 | Japan |
| 4-044280 | 2/1992 | Japan |

Col. 4, line 39, after "(77 K)" insert --.--.

Col. 6, line 58, change "radio frequency" to --radio-frequency--.

Col. 8, line 30, after "width" insert --(-- and delete ":" (first occurrence);
line 31, change "quasi binary" to --quasi-binary--.

UNITED STATES PATENT AND TRADEMARK OFFICE
CERTIFICATE OF CORRECTION

PATENT NO. : 5,312,803
DATED : May 17, 1994
INVENTOR(S) : TANAKA et al.

It is certified that error appears in the above-indentified patent and that said Letters Patent is hereby corrected as shown below:

Col. 9, line 62, change "min." to --min,--.

Col. 12, line 37, after "min" insert --+--.

Col. 13, line 11, change "X ray" to --X-ray--.

Col. 14, line 21, change "ore" to --or--.

Col. 15, line 37, change "15" to --17--;
       line 46, change "21" to --22--.

Signed and Sealed this

Fourteenth Day of February, 1995

Attest:

BRUCE LEHMAN

*Attesting Officer*     *Commissioner of Patents and Trademarks*